United States Patent [19]
Zell et al.

[11] Patent Number: 5,565,654
[45] Date of Patent: Oct. 15, 1996

[54] PRINTED CIRCUIT BOARD FOR PLUG-TYPE CONNECTIONS

[75] Inventors: Karl Zell, Niederpoecking; Juergen Seibold, Baierbrunn; Peter Seidel, Groebenzell, all of Germany

[73] Assignee: Siemens Aktiengesellschaft, Munich, Germany

[21] Appl. No.: 420,210

[22] Filed: Apr. 11, 1995

[30] Foreign Application Priority Data

Apr. 14, 1994 [DE] Germany ............................ 44 12 974.2

[51] Int. Cl.⁶ .................................................. H05K 1/14
[52] U.S. Cl. .......................... 174/265; 174/262; 439/82; 439/75; 361/791; 361/816
[58] Field of Search ................................ 174/262, 265, 174/264; 439/81, 82, 78, 75; 361/799, 800, 792, 794, 791, 788, 785, 816

[56] References Cited

U.S. PATENT DOCUMENTS

| | | | |
|---|---|---|---|
| 4,628,652 | 12/1986 | Wefels | 52/306 |
| 4,791,239 | 12/1988 | Shirahata et al. | 174/68.5 |
| 4,911,645 | 3/1990 | August et al. | 439/75 |
| 5,038,252 | 8/1991 | Johnson | 361/414 |
| 5,105,340 | 4/1992 | Lawrence | 361/414 |
| 5,327,326 | 7/1994 | Komoto et al. | 361/760 |

FOREIGN PATENT DOCUMENTS 0103192  6/1986  European Pat. Off. .

*Primary Examiner*—Laura Thomas
*Attorney, Agent, or Firm*—Hill, Steadman & Simpson, A Professional Corporation

[57] ABSTRACT

The invention is directed to a printed circuit board arrangement for plug-type connections composed of a blade connector and spring clip, whereby the individual contact passages are surrounded by electrically conductive shield plates that are connected to contactings carrying shield potential that are attached both at the backplane side as well as at the assembly side, and whereby both the contact blades and contact springs as well as the contactings are contacted and secured with press-in technique in the printed circuit boards fashioned as multi-layer multilayers. In order to create an adequate interconnect lead-through width between the contactings, the shield potential in the printed circuit board arrangement of the invention is conducted in a separate shield printed circuit board (3) that is electrically separated from the multilayer (1) by an insulating foil (2).

7 Claims, 2 Drawing Sheets

PRINTED CIRCUIT BOARD FOR PLUG-TYPE CONNECTIONS

BACKGROUND OF THE INVENTION

The present invention generally relates to a printed circuit board arrangement for plug-type connections between wiring backplanes and assembly printed circuit boards.

A plug-type connector for backplane wirings wherein a shielding ensues in an intermediate grid has been disclosed, for example, by European Patent Application 94 103 192. Such conventional plug-type connector arrangements are disadvantageous in that too small an interconnect lead-through width is established on the printed circuit boards between the contact blades and the shield contacts arranged in the intermediate grid.

SUMMARY OF THE INVENTION

An object of the instant invention is to create a printed circuit board arrangement wherein an adequate interconnect lead-through width is established. A further object is to provide such an arrangement which does not require any expensive multilayers.

These objects are achieved by the present invention in that the shield potential is carried by a separate shield printed circuit board that is electrically separated from the signal board by an insulating foil.

In the printed circuit board of the invention, the additional shield potential is eliminated from the multilayer and carried in a shield printed circuit board that is electrically separated by a foil.

In an embodiment, the plug-type connection has a blade connector portion fashioned as a rectangular housing open at one side for plugging onto the blades of a wiring backplane. A spring clip portion is provided which can be plugged into the blade connector. The spring clip portion has receptacle chambers equipped with contact springs and is firmly connected to an assembly printed circuit board. The blades and springs can be arranged parallel in a plurality of rows. Also, individual contact passages are surrounded by electrically conductive shielding plates that are connected to shield contacts attached in the intermediate grid both at the backplane side as well as at the assembly side and which carry shield potential. The shield contacts are charged with an appropriate potential. The contact blades, contact springs, and the shield contacts are contacted and secured within a press-in manner in the spiral printed circuit boards, which can be multi-layered.

In an embodiment, the thickness of the shield printed circuit board is dimensioned such that a connector pin can be pressed into the shield printed circuit board without projecting out at the bottom side.

As a result thereof, a largest possible interconnect lead-through is available to the signal board and the ground potential carried off via the assembly spring clip can be allocated to the backplane. Accordingly, since contact blades that were hitherto occupied with ground potential become free for signals given this arrangement, plug-type connectors can be made smaller and be arranged distributed on the printed circuit boards. Therefore, an indirect coding within a module frame is also possible. A smaller printed circuit board size is also possible due to this reduction in the plug size, substantially reducing the costs thereof.

In an embodiment of the printed circuit board arrangement of the invention, the shield contactings ensue only in partial regions of the printed circuit board. Due to the partial arrangement of the shield contactings, the size of the printed circuit board can be reduced to a minimum and the shield elimination need only be utilized where it is needed. The ground conductance or, respectively, shield conductance can be placed at an uncritical location by the developer.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The printed circuit board of the invention includes a multilayer board or signal printed circuit board 1 that carries the signal interconnects. A shield printed circuit board or shield board 3 is separated from the signal board 1 by an insulating foil 2 (prepreg). The printed circuit board arrangement is thereby arranged such that the shield board 3 lies neighboring the plug-type connection (not shown here).

Figure 1:
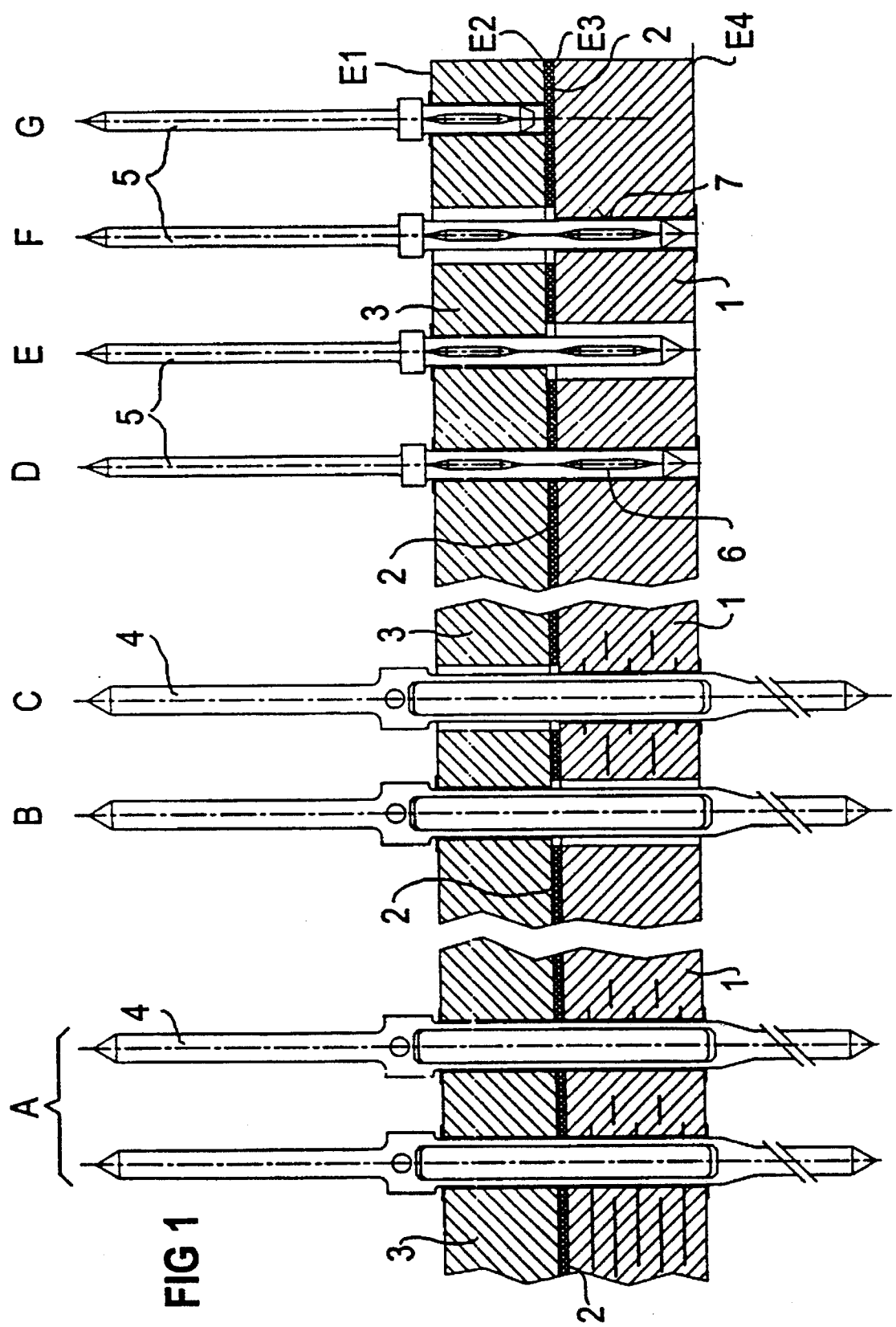
FIG. 1 is partial cross-sections through a printed circuit board arrangement of the present invention.

Various possible equippings of the printed circuit board arrangement are shown in FIG. 1, illustrating contact blades 4 for a signal line and grounded contact pins or shield contacts 5.

Figure 2:
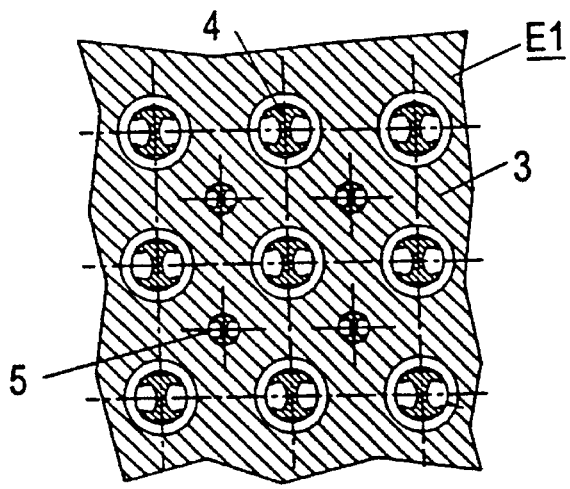
FIG. 2 is a partial section through the plane E1 indicated in FIG. 1.

The arrangement of the shield contacts 5 in the intermediate grid between the contact blades 4 is shown in FIG. 2.

The shield board 3 carries ground potential in a plane E1 and in a plane E2. The thickness of the shield board 3 is dimensioned such that a pin can be pressed into the shield board 3 without having it project beyond the other side. Such an equipping referenced G in FIG. 1 is the normal case.

Figure 3:
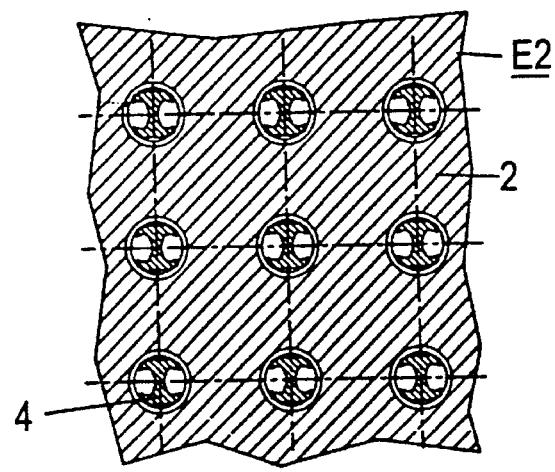
FIG. 3 is a partial section through the plane E2 indicated in FIG. 1.

FIG. 2 shows a plan view onto the plane E1, i.e. onto the surface of the shield printed circuit board 3 facing toward the plug-type connector. FIG. 3 shows a view onto the plane E2, i.e. a view onto the side of the insulating foil 2 facing toward the plug-type connector.

Figure 4:
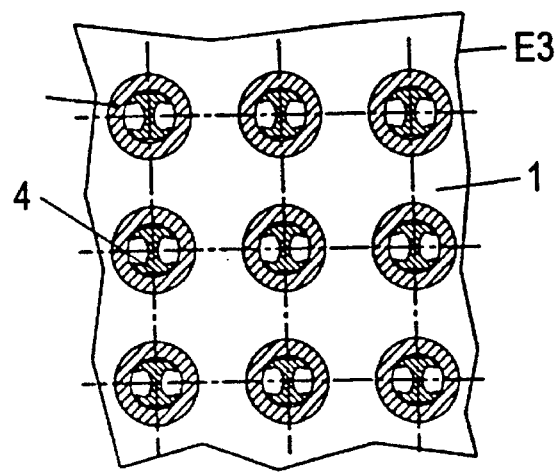
FIG. 4 is a section through the plane E3 indicated in FIG. 1.

FIG. 4 shows a plan view onto the plane E3, i.e. onto the side of the signal board 1 facing toward the plug-type connection. It may be seen in conjunction with FIG. 1 that FIGS. 2 through 4 are only valid for the equipping referenced G in FIG. 1.

The inventive solution is based on the idea of eliminating additional ground potential from the signal board 1 and carrying it in a separate shield board 3 that is electrically separated by an insulating foil 2. The board is so thick that the shield contacting can be pressed thereinto with its press-in region without projecting out at the bottom (case G). A largest possible interconnect lead-through (lane width) for the signal interconnects is thus again available to the signal board and the shield potential eliminated via the plug-type connectors can nonetheless be allocated to the printed circuit boards.

The contact blade 4 can contact both boards (case A) or only the shield board 3 (case B) wherever the plug-type connectors require shield or, respectively, ground potential. The standard contacting for the contact blade 4 is the arrangement shown under C wherein the contact blade contacts only the signal board 1.

It is likewise possible that the shield contactings contact both boards, i.e. the signal board 1 and the shield board 3 (case D), or only the shield printed circuit board 3 (case E) or—in special instances—only the signal board 1 (case F) with different press-in zones or, respectively, different bores in the printed circuit board arrangement. In FIG. 1, 6 therefore indicates a through connection between the shield board 3 and the signal board 1 and 7 indicates a connection for the shield potential to the signal board 1.

The printed circuit board size of the shield board can be reduced to a minimum by a partial arrangement of the ground pins and can also be utilized only where there is a necessity to do so. The shield conductance can then be placed at an uncritical place and can ensue with the embodiments of case A and D or with general connector elements. The printed circuit board arrangement of the invention also makes an improvement of an existing assembly possible, this requiring an e.m.c. elimination, subsequently retrofitting with a shield board strip with shield contacting having short press-in zones.

Since the blades previously occupied with ground potential in traditional module frames become free for signals given the printed circuit board arrangement of the invention, plug connectors can be made smaller and can be arranged distributed on the printed circuit boards, as a result whereof an indirect coding within an module frame is also possible. A smaller printed circuit board is also possible as a result is this smaller plug, this in turn reducing the costs thereof. Partial plug parts can now also be provided with an e.m.c. or, respectively, ground conductance.

It should be understood that various changes and modifications to the presently preferred embodiments will be apparent to those skilled in the art. Such changes and modifications can be made without departing from the spirit and scope of the present invention and without diminishing its attendant advantages. Therefore, such changes and modifications are intended to be covered by the appended claims.

What is claimed is:

1. An improved printed circuit board arrangement for a plug-type connection in a signal printed circuit board of the type in which the plug-type connection includes a blade connector for plugging onto the blades of a wiring backplane and a spring clip matably insertable into the blade connector, the spring clip having receptacle chambers with contact springs, the spring clip being and is firmly connected to the assembly printed circuit board, the blades and springs being arranged parallel in a plurality of rows, wherein individual contact passages are surrounded by electrically conductive shielding plates that are connected to shield contacts that are attached in an intermediate grid at a backplane side as well as at an assembly side and carry shield potential, the shield contacts being charged with an appropriate potential, and wherein both the contact blades and contact springs as well as the shield contacts are contacted and secured in a press-in manner in the signal printed circuit board which is formed of multiple layers;

wherein the improvement comprises:

a shield printed circuit board to conduct the shield potential, the shield printed circuit board being disposed against the signal printed circuit board; and an electrically insulating foil disposed between the shield printed circuit board and the signal printed circuit board.

2. The printed circuit board arrangement according to claim 1 wherein the thickness of the shield printed circuit board is dimensioned such that a contact pin can be pressed into the shield printed circuit board without projecting out at the lower side.

3. The printed circuit board arrangement according to claim 1 further comprising:

a press-in zone for each contact blade defined by respective bores in the signal and shield printed circuit boards, the bores being shaped such that each contact blades contacts at least one of the boards.

4. The printed circuit board arrangement according to claim 1 further comprising:

a press-in zone for each shield contact defined by respective bores in the signal and shield printed circuit boards the bores being shaped such that each shield contact contacts at least one of the boards.

5. The printed circuit board arrangement according to claim 1 wherein the shield contacts engage the shield printed circuit board only in partial regions of the printed circuit board arrangement.

6. A shield for a signal printed circuit board, the shield comprising:

an electrically insulating foil disposed against a surface of the signal printed circuit board;

a shield board disposed against the foil, the shield board being grounded; and a press-in zone for a grounded contact pin defined by a bore in the shield board alignable on a bore in the signal printed circuit board, the bore being shaped such that the contact pin contacts at least one of the boards.

7. A shield for a signal printed circuit board, the shield comprising:

an electrically insulating foil disposed against a surface of the signal printed circuit board;

a shield board disposed against the foil, the shield board being grounded; and a press-in zone for a blade contact from a blade connector defined by a bore in the shield board alignable on a bore in the signal printed circuit board, the bore being shaped such that the contact blade contacts at least one of the boards.

* * * * *